United States Patent
Cheah et al.

(10) Patent No.: US 11,393,758 B2
(45) Date of Patent: Jul. 19, 2022

(54) POWER DELIVERY FOR EMBEDDED INTERCONNECT BRIDGE DEVICES AND METHODS

(71) Applicant: Intel Corporation, Santa Clara, CA (US)

(72) Inventors: Bok Eng Cheah, Bukit Gambir (MY); Jackson Chung Peng Kong, Tanjung Tokong (MY); Loke Yip Foo, Bayan Baru (MY); Wai Ling Lee, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 61 days.

(21) Appl. No.: 16/451,530

(22) Filed: Jun. 25, 2019

(65) Prior Publication Data

US 2020/0083170 A1 Mar. 12, 2020

(30) Foreign Application Priority Data

Sep. 12, 2018 (MY) ........................ PI 2018703240

(51) Int. Cl.
| | |
|---|---|
| *H01L 23/538* | (2006.01) |
| *H01L 25/16* | (2006.01) |
| *H01L 25/00* | (2006.01) |
| *H01L 23/498* | (2006.01) |
| *H01L 23/00* | (2006.01) |
| *H01L 21/48* | (2006.01) |

(52) U.S. Cl.
CPC ...... *H01L 23/5381* (2013.01); *H01L 21/4857* (2013.01); *H01L 23/5383* (2013.01); *H01L 23/5386* (2013.01); *H01L 25/16* (2013.01); *H01L 25/50* (2013.01); *H01L 23/49816* (2013.01); *H01L 24/16* (2013.01); *H01L 24/32* (2013.01); *H01L 24/73* (2013.01); *H01L 2224/16225* (2013.01); *H01L 2224/32225* (2013.01); *H01L 2224/73204* (2013.01); *H01L 2924/19041* (2013.01); *H01L 2924/19105* (2013.01)

(58) Field of Classification Search
None
See application file for complete search history.

(56) References Cited

U.S. PATENT DOCUMENTS

| | | | | |
|---|---|---|---|---|
| 6,434,016 | B2 * | 8/2002 | Zeng | H05K 1/181 361/760 |
| 7,402,901 | B2 * | 7/2008 | Hatano | H01L 24/05 257/684 |

(Continued)

FOREIGN PATENT DOCUMENTS

| | | | | |
|---|---|---|---|---|
| WO | WO-2018004692 A1 * | 1/2018 | | H01L 23/5386 |
| WO | WO-2018182658 A1 * | 10/2018 | | H01L 21/76873 |

*Primary Examiner* — Telly D Green
(74) *Attorney, Agent, or Firm* — Schwegman Lundberg & Woessner, P.A.

(57) ABSTRACT

A semiconductor device and associated methods are disclosed. In one example, dies are interconnected through a bridge in a substrate. A reference voltage stack extends over at least a portion of the interconnect bridge, and a passive component is coupled to the reference voltage stack. In one example, the passive component helps to reduce interference in the power supply to components in the semiconductor device, such as the dies and the interconnect bridge.

13 Claims, 16 Drawing Sheets

(56) References Cited

U.S. PATENT DOCUMENTS

| | | | | |
|---|---|---|---|---|
| 10,211,069 B2* | 2/2019 | Chuah | | H05K 3/30 |
| 10,643,945 B2* | 5/2020 | Collins | | H01L 25/18 |
| 10,978,399 B2* | 4/2021 | Darmawikarta | | H01L 23/53228 |
| 2009/0244874 A1* | 10/2009 | Mahajan | | H05K 1/142 |
| | | | | 361/809 |
| 2012/0106117 A1* | 5/2012 | Sundaram | | H01L 25/18 |
| | | | | 361/808 |
| 2013/0168854 A1* | 7/2013 | Karikalan | | H01L 24/73 |
| | | | | 257/738 |
| 2014/0048928 A1* | 2/2014 | Li | | H01L 23/49811 |
| | | | | 257/737 |
| 2014/0117552 A1* | 5/2014 | Qian | | H01L 23/53228 |
| | | | | 257/762 |
| 2014/0332966 A1* | 11/2014 | Xiu | | C09J 163/00 |
| | | | | 257/773 |
| 2015/0001717 A1* | 1/2015 | Karhade | | H01L 24/17 |
| | | | | 257/741 |
| 2015/0001733 A1* | 1/2015 | Karhade | | H01L 23/49894 |
| | | | | 257/774 |
| 2016/0049316 A1* | 2/2016 | Chuah | | H01L 23/5389 |
| | | | | 438/125 |
| 2016/0088736 A1* | 3/2016 | Sankman | | H05K 3/0017 |
| | | | | 361/748 |
| 2018/0005945 A1* | 1/2018 | Pietambaram | | H01L 23/5385 |
| 2018/0182699 A1* | 6/2018 | Lai | | H01L 23/5383 |
| 2018/0286812 A1* | 10/2018 | Jain | | H01L 24/16 |
| 2018/0331042 A1* | 11/2018 | Manusharow | | H01L 23/49822 |
| 2018/0366438 A1* | 12/2018 | Kim | | H01L 23/585 |
| 2019/0041923 A1* | 2/2019 | Atsatt | | H03K 19/0008 |
| 2019/0042127 A1* | 2/2019 | Weber | | G06F 12/0875 |
| 2019/0206792 A1* | 7/2019 | Collins | | H01L 25/0655 |
| 2019/0304911 A1* | 10/2019 | Collins | | H01L 23/147 |
| 2019/0304915 A1* | 10/2019 | Jain | | H01L 23/147 |
| 2020/0006236 A1* | 1/2020 | Collins | | H01L 21/486 |
| 2020/0035606 A1* | 1/2020 | Bhagavat | | H01L 25/0655 |
| 2020/0051915 A1* | 2/2020 | Darmawikarta | | H01L 23/00 |
| 2020/0235051 A1* | 7/2020 | Collins | | H01L 23/49838 |
| 2020/0243448 A1* | 7/2020 | Qian | | H01L 24/19 |
| 2020/0266149 A1* | 8/2020 | Xu | | H01L 25/0655 |
| 2021/0111088 A1* | 4/2021 | Jain | | H01L 23/5381 |

* cited by examiner

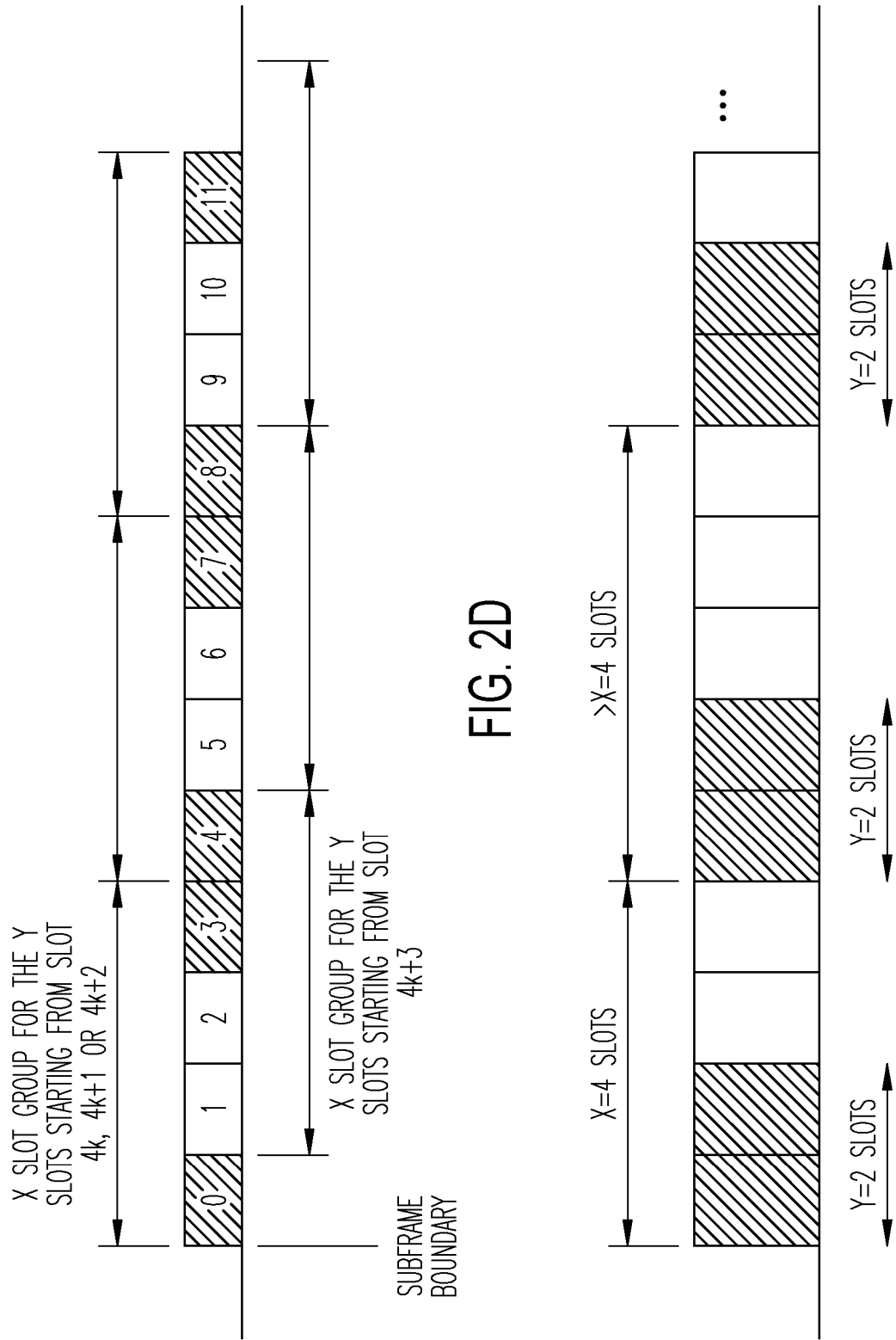

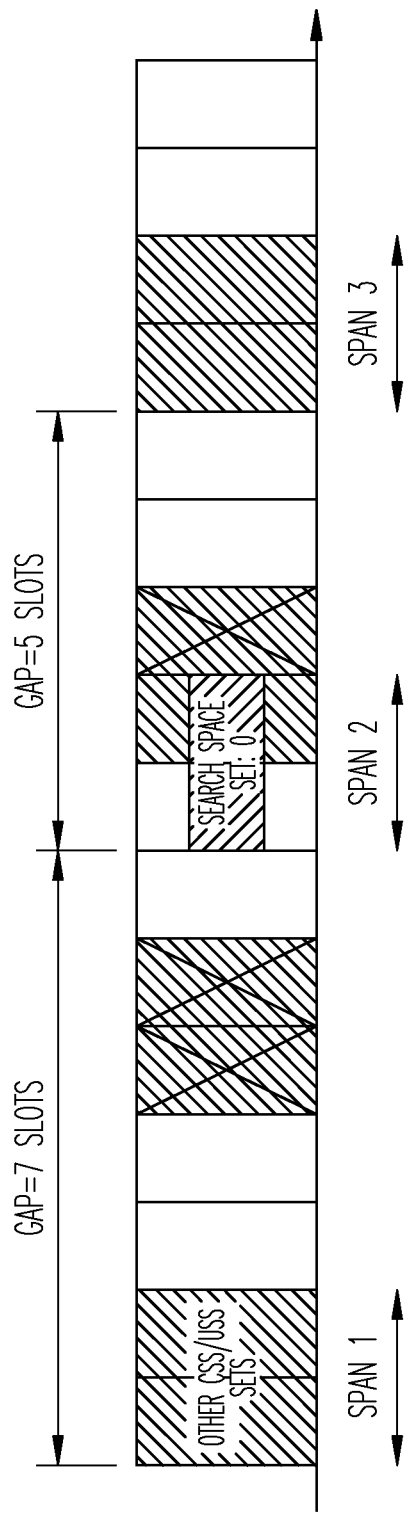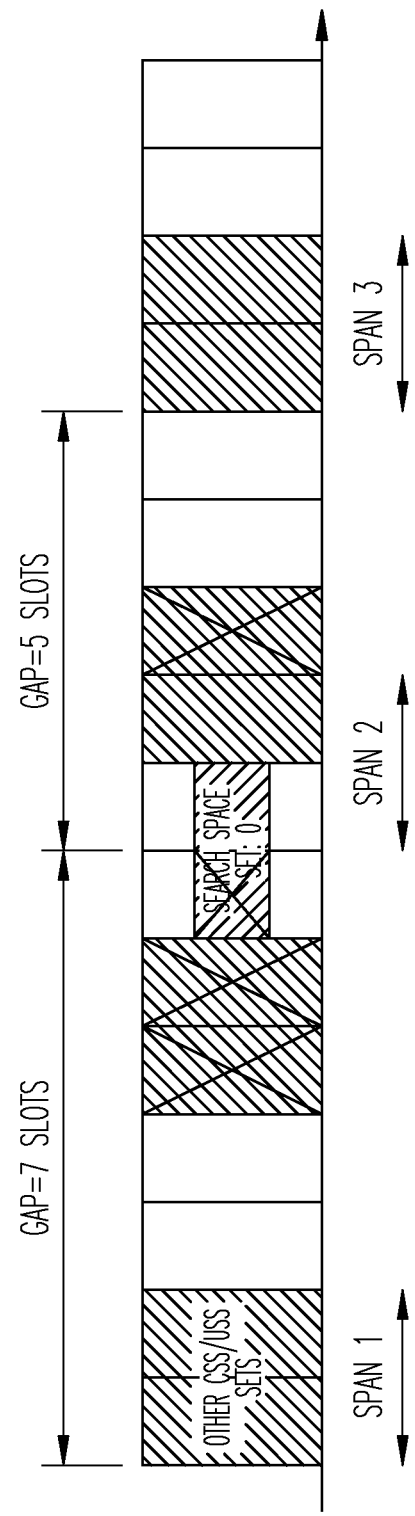
FIG. 5
FIG. 6

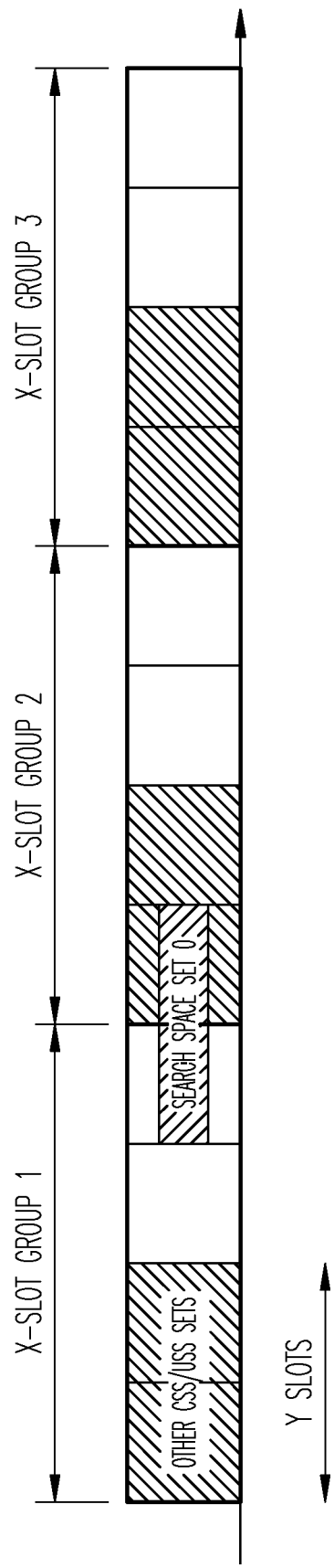

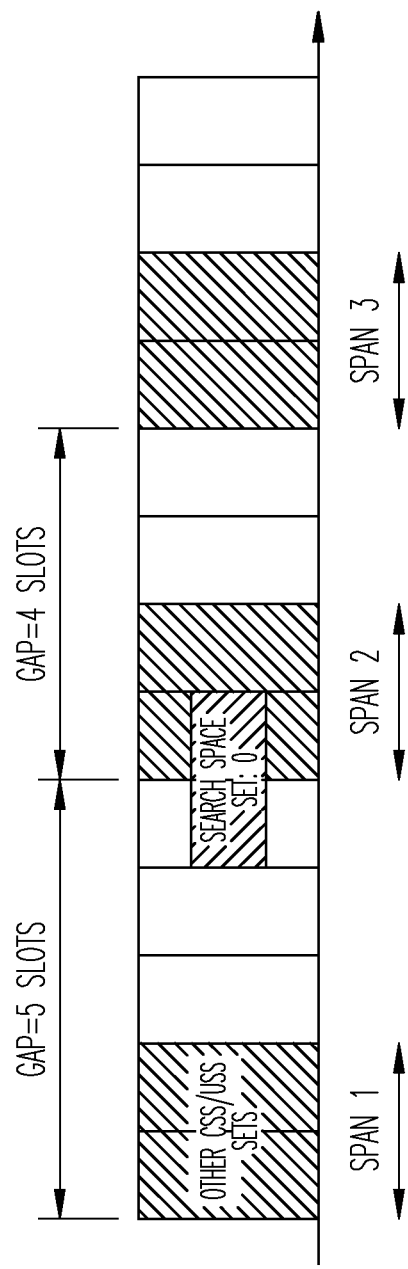
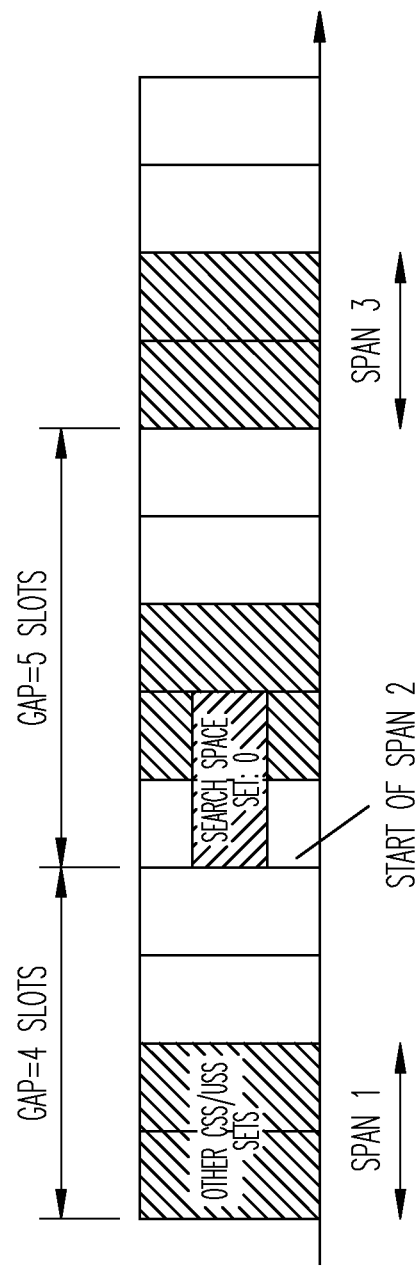
FIG. 10
FIG. 11

US 11,393,758 B2

POWER DELIVERY FOR EMBEDDED INTERCONNECT BRIDGE DEVICES AND METHODS

PRIORITY APPLICATION

This application claims the benefit of priority to Malaysian Application Serial Number PI 2018703240, filed Sep. 12, 2018, which is incorporated herein by reference in its entirety.

TECHNICAL FIELD

Embodiments described herein generally relate to power delivery networks and interconnection of semiconductor devices.

BACKGROUND

Some semiconductor devices face challenges of electrical performance limitations due to large power delivery network inductance on multi-chip package with interconnect bridge applications. A larger power delivery network may experience an inductance loop that increases power supply noise. Unwanted noise may result in signaling jitters and make device performance scaling more difficult. New device configurations and methods are desired to address these, and other technical challenges.

BRIEF DESCRIPTION OF THE DRAWINGS

FIG. 3 shows a top sectional view at an intermediate layer of the semiconductor device from FIG. 2, in accordance with some example embodiments.

FIG. 5 shows a cross section of a semiconductor device in accordance with some example embodiments.

FIG. 6 shows a top view of a semiconductor device in accordance with some example embodiments.

DESCRIPTION OF EMBODIMENTS

Figure 1A:
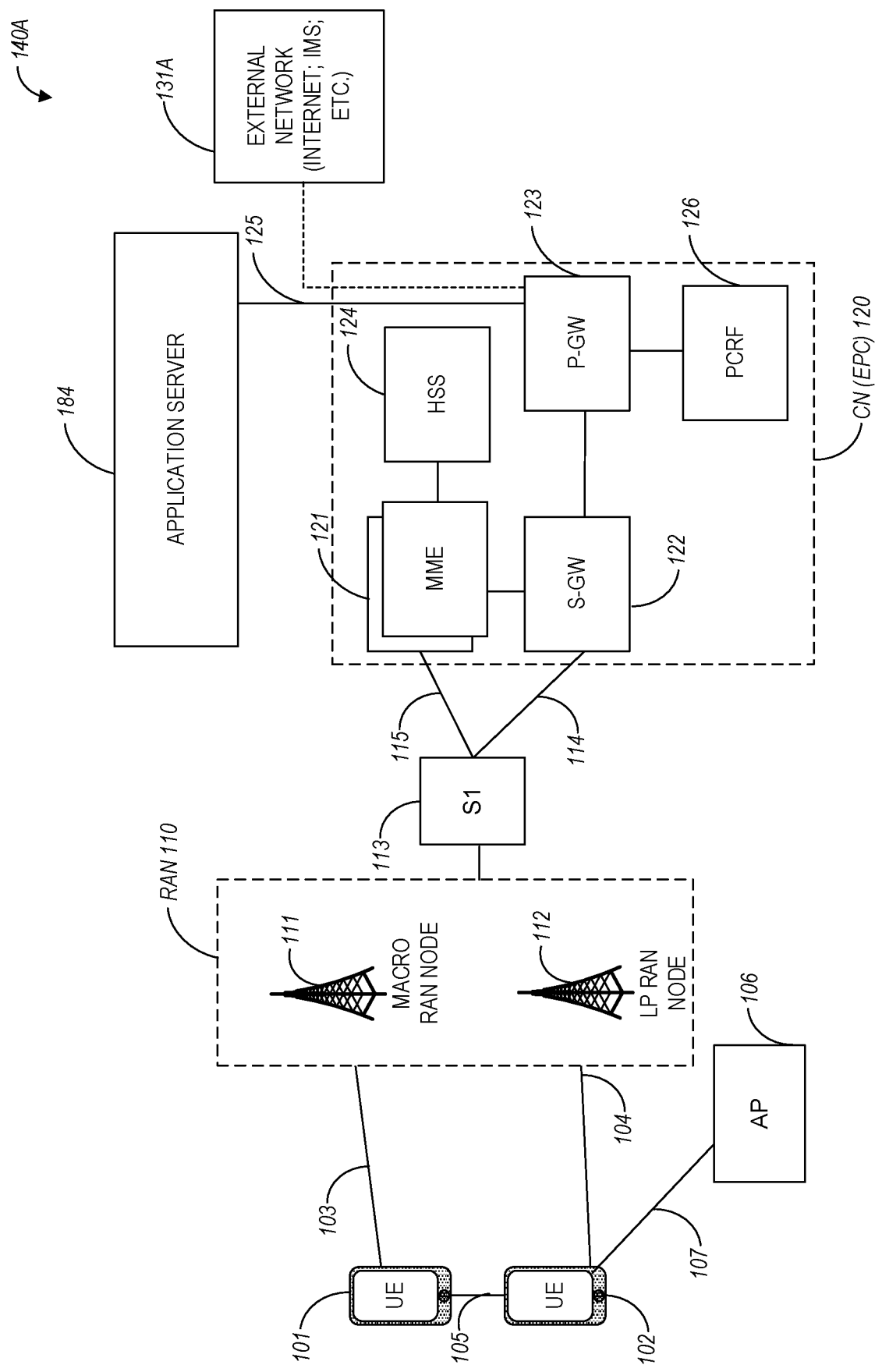
FIG. 1 shows a cross section of a semiconductor device shown in FIG. 2 in accordance with some example embodiments.
Figure 1B:
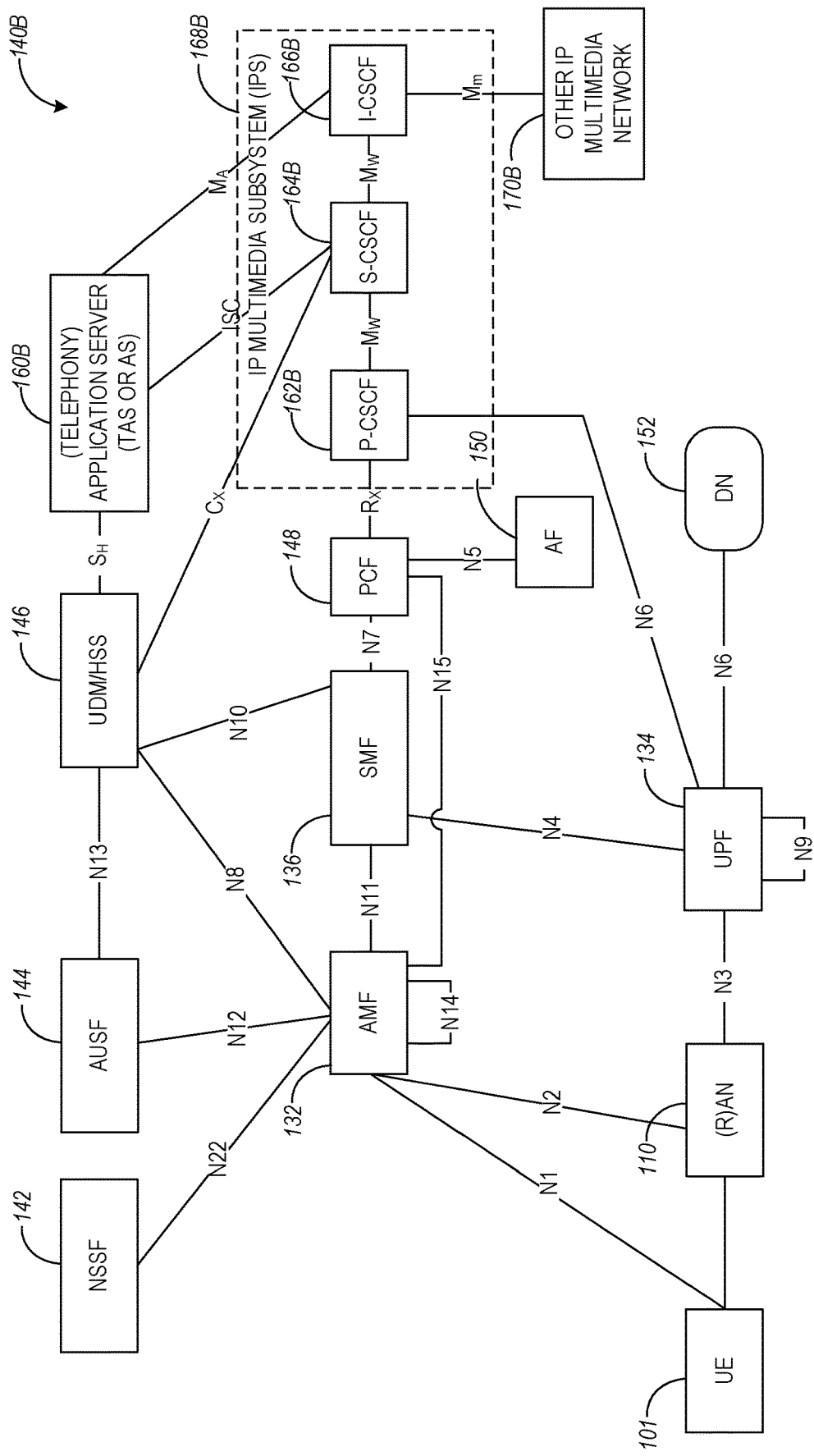
Figure 1C:
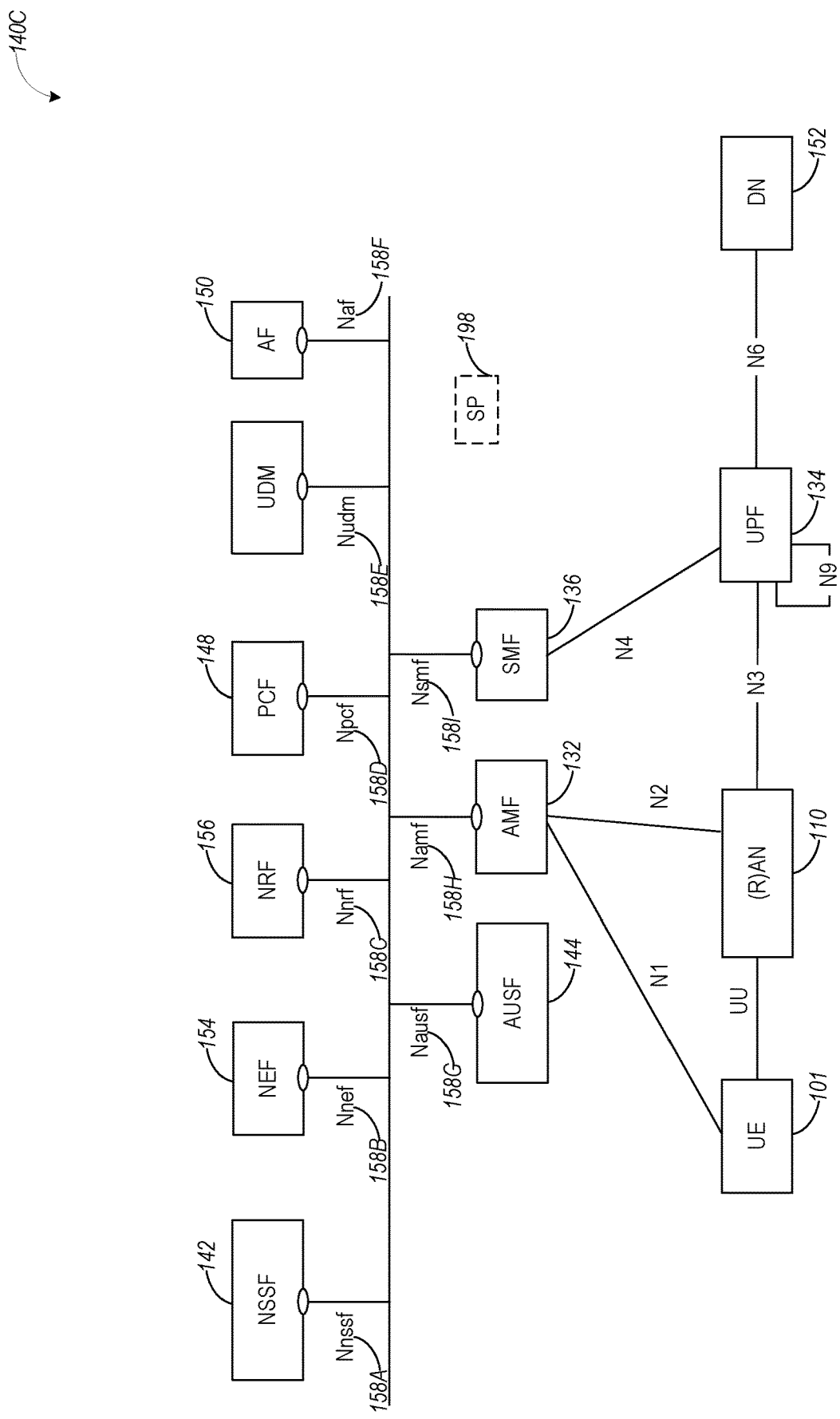
Figure 1D:
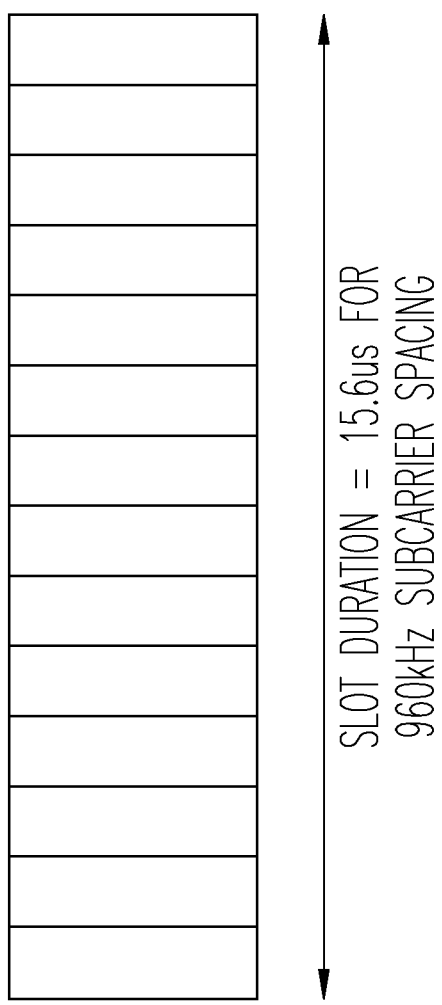

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

In the figures and the text that follows, the terms "top" and "bottom" are used to show orientations of particular features on particular elements, or relative orientations of one element to another element. The designations of top and bottom are used merely for convenience and clarity, and are not intended to represent absolute orientation or direction. For example, a "top" surface of an element remains a top surface regardless of an absolute orientation of the element, even if the element is inverted during storage or use. This document uses the common convention of a chip package being positioned on top of a motherboard, which establishes directions of up and down, and top and bottom, relative to this convention.

FIG. 1 shows a semiconductor device 100 according to selected examples. The semiconductor device 100 of FIG. 1 is a chip package, including a first die 102 and a second die 104 coupled to a top surface 107 of a substrate 106. An interconnect bridge 110 is shown embedded within the substrate 106, and coupled between the first die 102 and the second die 104. Solder balls 108 are shown on a bottom surface of the substrate 106, and may communicate signals, power, etc. between outside circuitry such as a motherboard (not shown) and the dies and/or the interconnect bridge 110.

Within the interconnect bridge 110, a number of traces 112 are shown. The traces 112 route communications between the first die 102 and the second die 104. In one example, an interconnect bridge may be formed separately and includes highly dense interconnect traces formed using a more precise manufacturing technique that is practical in forming the rest of the substrate 106. By using an interconnect bridge, one or more various dies (such as 102, 104) can be connected together in a fine pitch with high bandwidth. When combining multiple dies (102, 104), because different dies can be chosen for different end use semiconductor devices (such as graphics dies, communication dies, processor dies, etc) the manufacturing process becomes more flexible. Also, because smaller dies may be used, the individual yields on the smaller dies is higher. As a result, the yield of a bridged multi-die product is higher than if a larger circuit were formed on a single larger die.

In one example, the interconnect bridge 110 is formed from silicon. Silicon processing techniques at small pitches are well understood, and can be adapted for high density interconnect bridges. In one example, the silicon bridge 110 comprises a plurality of metallization layers configured to carry electrical signals (e.g., input/output signals), power supply and to provide current return path and/or electrical shielding. Although silicon is used as an example, other semiconductor materials may also be used. In another example, the interconnect bridge 110 is formed from organic materials as dielectric, and metals, such as copper, or other conductors for traces 112.

FIG. 1 further shows a reference voltage stack 120 extending over at least a portion of the interconnect bridge 110. In the example shown, the reference voltage stack 120 includes conductors that include a power supply 122 and a ground supply 124. In one example, the conductors in the reference voltage stack 120 are trace lines. In one example, the conductors in the reference voltage stack 120 include reference planes, having higher surface area than trace lines. Although power and ground are used as examples, one of ordinary skill, having the benefit of the present disclosure, will recognize other voltages, whatever the actual voltage magnitude or polarity, may be used.

FIG. 1 further shows a passive component 140 located on the substrate 106 and coupled to the reference voltage stack 120. In one example, the passive component 140 includes one or more capacitors, such as multi-layer ceramic capacitors or silicon capacitors. In one example, the passive component 140 includes one or more inductors. In one example, the passive component 140 includes one or more resistors. In one example, multiple passive components 140 are used together in the locations shown in the figures. In one example, the passive component 140 includes a voltage regulator that includes multiple passive devices, including, but not limited to capacitors, inductors, and resistors. Other passive components may be used without departing from the scope of the invention.

In one example, it is cheaper to use a separate, passive component 140 than to integrate a passive component function into one or more of the dies 102, 104. Integration of a passive component into one or more of the dies also sacrifices a large amount of valuable die real estate that is needed for transistors and other operating components. In one example, by using wide conductors in the reference voltage stack 120, a connection to the passive component 140 is easier to make, and more reliable. For example, when one or more planes are used as conductors in the reference voltage stack 120, location and connection to the passive component 140 becomes relatively easy.

In the example of FIG. 1, the power supply 122 is shown coupled to the passive component 140 using a power connection 123. The ground supply 124 is shown coupled to the passive component 140 using a ground connection 125. In the example shown, the ground connection 125 passes though an opening 121 in the power supply 122 to reach the ground supply 124. In one example, the power connection 123 and the ground connection 125 comprise micro-via and/or metal routing coupled to one or more substrate contact pads, and coupled to the passive component 140 through, for example, a solder connection.

In one example, the reference voltage stack 120 is further coupled to one or more levels within the interconnect bridge 110. In the example shown a first connection 127 couples to an interconnect bridge power conductor 126, and a second connection 129 couples to an interconnect bridge ground conductor 128. In the example shown, the first connection 127 passes through an opening 131 in the ground (Vss) supply 124 to reach the power supply 122 and the interconnect bridge power conductor 126. In selected examples, the power conductor 126 and the ground conductor 128 are planes within the interconnect bridge 110, although the invention is not so limited.

In operation, the passive component 140 provides a noise reduction function in the power delivery network to components such as the dies 102, 104, and the interconnect bridge 110. By locating the passive component 140 closely to all of these components (dies 102, 104, and interconnect bridge 110) the noise reduction function is further enhanced.

Figure 2A:
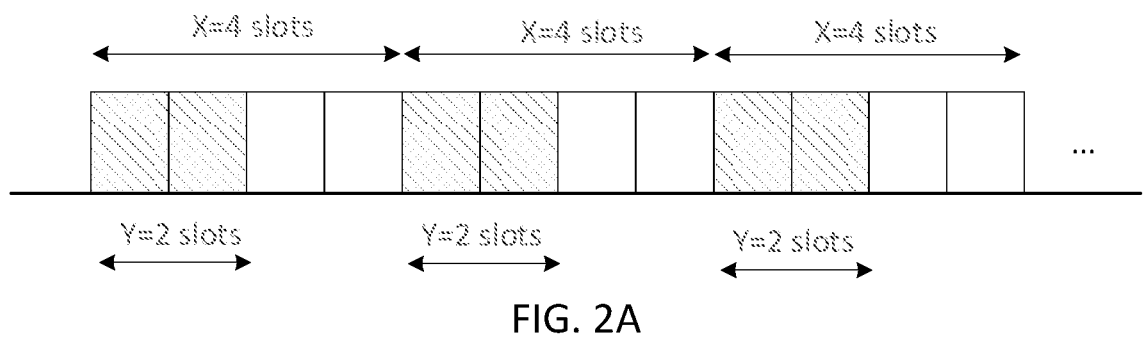
FIG. 2 shows a top view of a semiconductor device in accordance with some example embodiments.
Figure 2B:
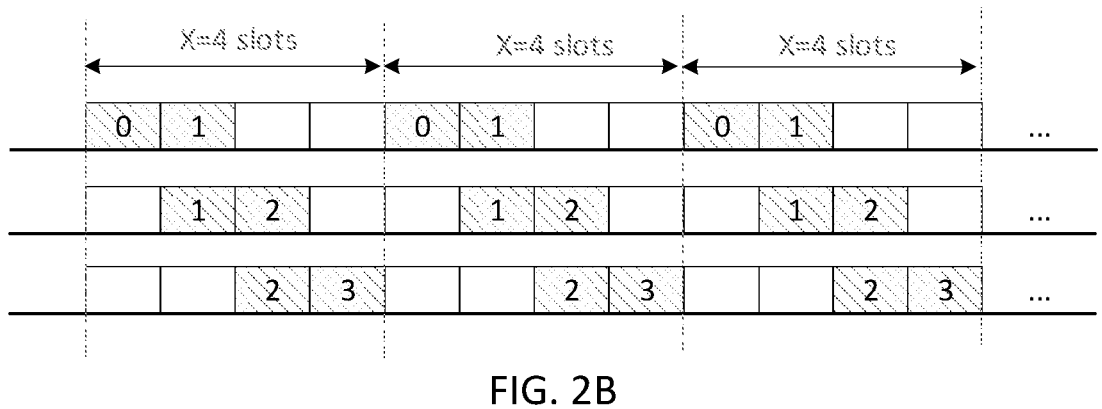
Figure 2C:
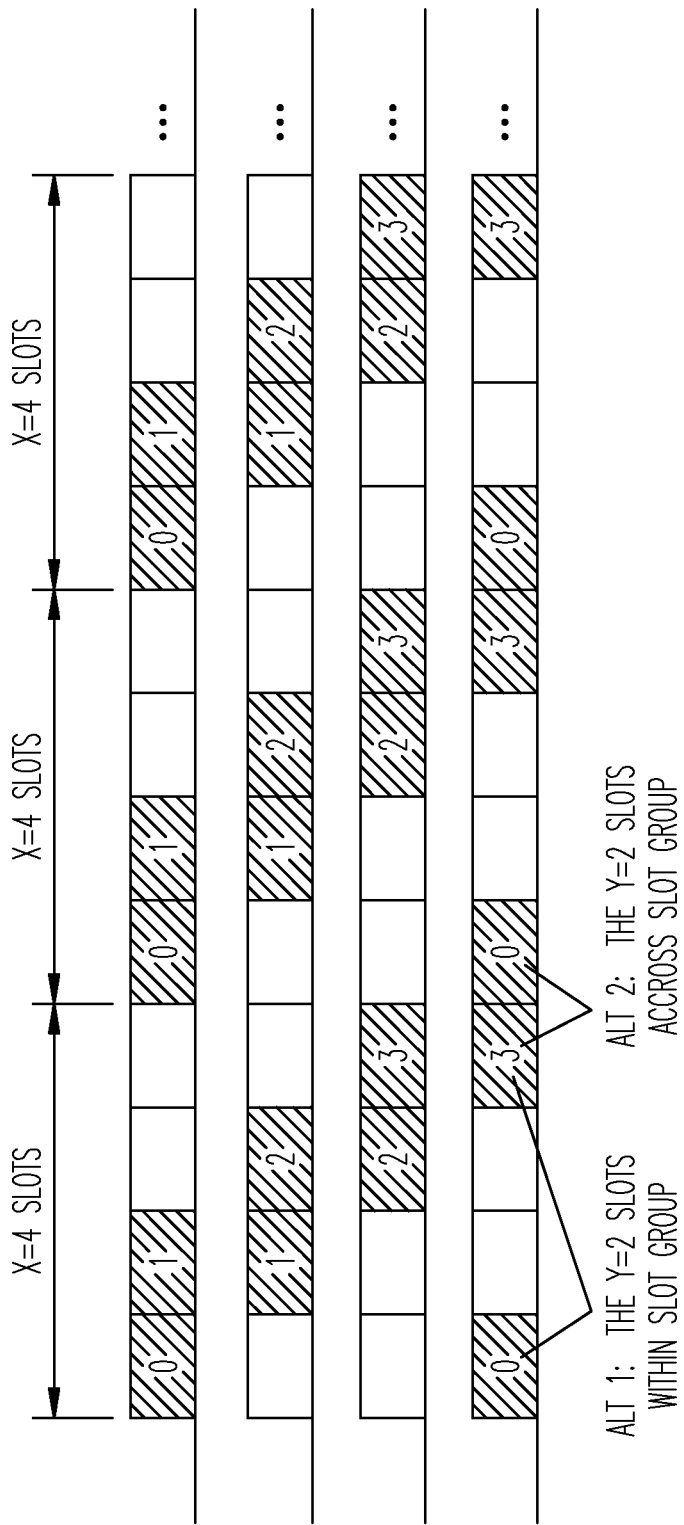

FIG. 2 shows a top view of the semiconductor device 100 example from FIG. 1. The first die 102 and the second die 104 are shown, with two example passive devices 140 and 142. As illustrated in FIG. 2, passive devices 140, 142 may be oriented in a number of different ways depending on geometric or functional needs. In one example, it may be advantageous to orient the passive device as shown with device 142. In the orientation shown by device 142, a gap between the dies 102, 104 can be reduced because the narrower dimension of passive device 142 is oriented between the dies 102, 104.

In the example of FIG. 2, the power supply 122 of the reference voltage stack 120 is shown as a plane. A number of vias 132 are shown on a periphery of the power supply 122 that couple to power network or sources, such as silicon dies 102, 104 and/or a motherboard (not shown) through respective solder balls 108 from FIG. 1. As illustrated in FIG. 3, in selected examples, some vias 134 couple to power (such as Vcc rail), and some vias 134 couple to ground (such as Vss). In one example, the vias 134 from FIG. 3 pass through openings 133 that alternate with vias 132 as shown in FIG. 2. In this way both power and ground reference voltages may be coupled to more than one stacked plane such as power supply 122, even though they occupy the same footprint in the semiconductor device 100.

FIG. 3 shows another top view of the semiconductor device 100 example from FIG. 1. The view in FIG. 3 shows a lower level top sectional view than in FIG. 2. The ground supply 124 is visible in the view of FIG. 3, with the power supply 122 removed from the view. In the example of FIG. 3, the ground supply 124 of the reference voltage stack 120 is shown as a plane. Similar to FIG. 2, a number of vias 134 are shown on a periphery of the ground supply 124 that couple to ground voltage (Vss) source, such as silicon dies 102, 104 and/or motherboard (not shown) through respective package bumps 130 and at solder balls 108 from FIG. 1. In one example, the vias 132 from FIG. 2 pass through openings 135 that alternate with vias 134 as shown in FIG. 3. As discussed above, in one example the vias 134 are different from vias 132. In one example, the vias 134 alternate with vias 132 to couple to external ground or power respectively.

The opening 121 through the power supply 122 is shown from above in FIG. 2, and illustrates one example of how the passive device 140 is coupled to the lower ground supply 124. In one example, when planes are used for power supply and ground supply 124, a larger passive device 140 is more easily coupled between power 122 and ground 124. In some configurations, it may be difficult to couple a passive device to narrow power or ground trace lines between dies 102, 104. In one example, using planes for power and ground referencing provides a larger surface area to couple to making secure connections easier, and making location tolerances more forgiving.

Figure 4A:
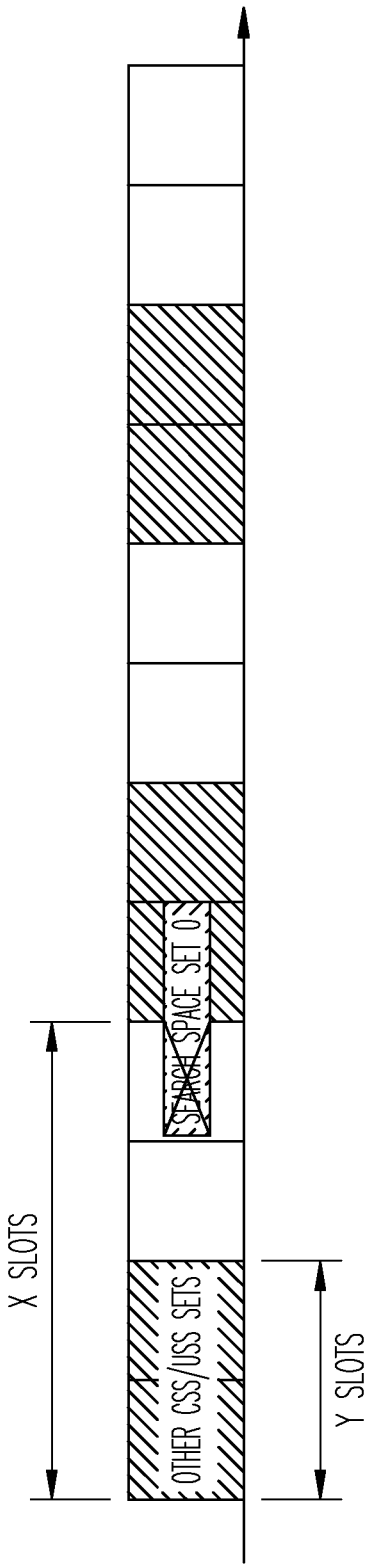
FIG. 4 shows another top sectional view at an intermediate layer of the semiconductor device from FIG. 2, in accordance with some example embodiments.
Figure 4B:
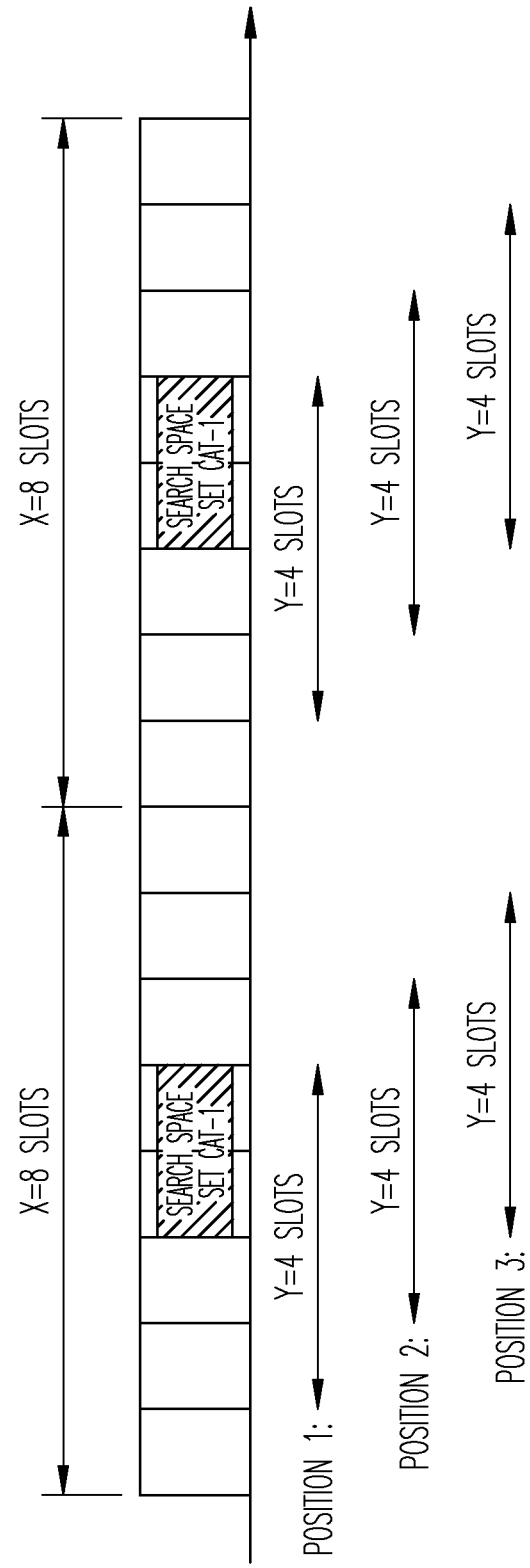
Figure 4C:
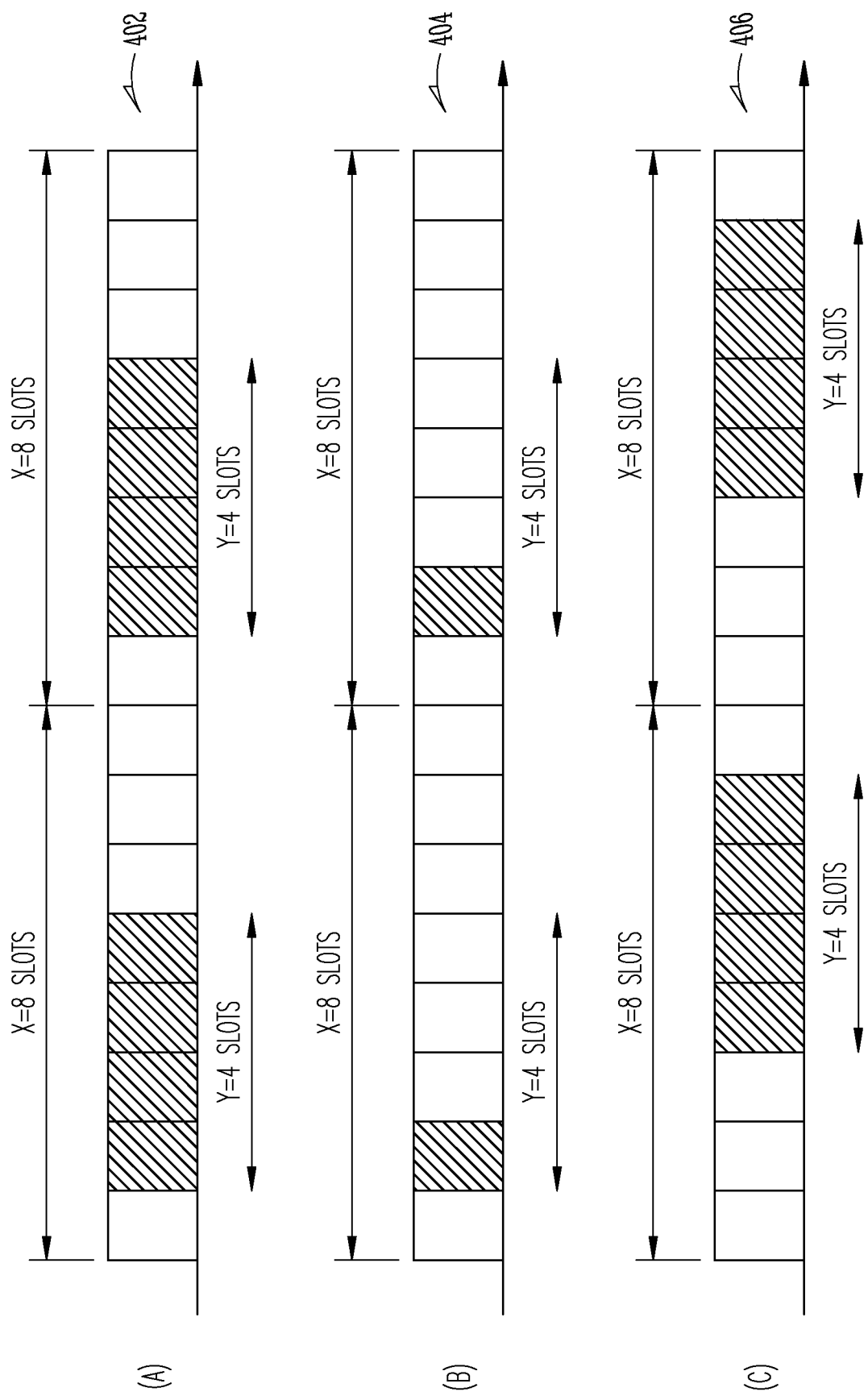

FIG. 4 shows another top view of the semiconductor device 100 example from FIG. 1. The view in FIG. 4 shows a lower level top sectional view than in FIG. 2 or 3. The interconnect bridge 110 is shown, and the number of traces 112 are illustrated. In addition, FIG. 4 shows example locations for the first connection 127 that couples to the interconnect bridge power conductor 126, and the second connection 129 couples to the interconnect bridge ground conductor 128. As can be seen in FIG. 4, multiple first connections 127 and second connections 129 may be used.

FIG. 5 shows another example configuration for a semiconductor device 200. The semiconductor device 200 of FIG. 5 is a chip package, including a first die 202 and a second die 204 coupled to a top surface 207 of a substrate 206. An interconnect bridge 210 is shown embedded within the substrate 206, and coupled between the first die 202 and the second die 204.

FIG. 5 further shows a reference voltage stack 220 extending over at least a portion of the interconnect bridge 210. In one example the reference voltage stack 220 is similar to the reference voltage stack 120 described in examples above. In one example, the conductors in the reference voltage stack 220 include reference planes, having higher surface area than trace lines. Although power and ground are used as examples, one of ordinary skill, having the benefit of the present disclosure, will recognize other voltages, whatever the actual voltage magnitude or polarity, may be used.

FIG. 5 further shows a passive component 240 embedded within the substrate 206 and coupled to the reference voltage stack 220. By embedding the passive component 240 below a surface 207 of the substrate 206, the dies 202, 204 may be located closer together as shown by dimension 208. In selected examples, one or more of the dies 202, 204 may partially or fully overlap a top portion of the passive component 240.

In one example, the passive component 240 includes one or more capacitors, such as multi-layer ceramic capacitors or silicon capacitors. In one example, the passive component 240 includes one or more inductors. In one example, the passive component 240 includes one or more resistors. In one example, multiple passive components 240 are used together in the locations shown in the figures. In one example, the passive component 240 includes a voltage regulator that includes multiple passive devices, including, but not limited to capacitors, inductors, and resistors. Other passive components may be used without departing from the scope of the invention.

FIG. 6 shows a top view of another example configuration for a semiconductor device 300. The semiconductor device 300 of FIG. 6 is a chip package, including a first die 302 and a second die 304 coupled to a top surface of a substrate 306. An interconnect bridge 310 is shown embedded within the substrate 306, and coupled between the first die 302 and the second die 304.

FIG. 6 further shows a power supply level of a reference voltage stack extending over at least a portion of the interconnect bridge 310. Two example passive devices 340 and 342 are shown. As illustrated in FIG. 6, passive devices 340, 342 may be oriented in a number of different ways depending on geometric or functional needs. FIG. 6 illustrates an example with three reference voltage levels, including a ground voltage (Vss) level (not shown) and two different power supply voltage (Vcc) levels. In the example shown, a first partial plane 320 and a second partial plane 322 are each configured with a different power level. A gap 324 is shown between the first partial plane 320 and the second partial plane 322, providing electrical isolation between the two planes 320, 322. In one example, similar to FIGS. 1 and 5, a ground plane is located separately (for example below) the first partial plane 320 and the second partial plane 322.

Although the example of FIG. 6 shows coplanar partial planes 320, 322, the invention is not so limited. Other examples may include multiple power planes that are on different levels of a reference voltage stack, and are not coplanar.

Figure 7:
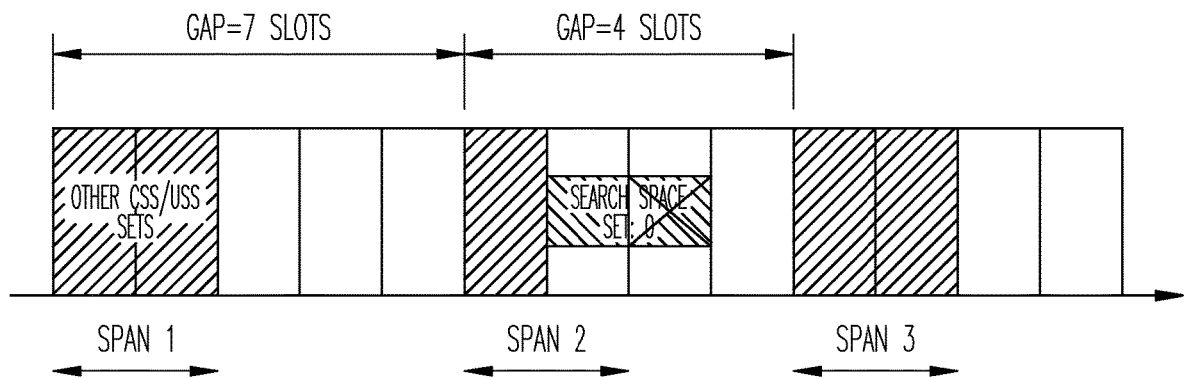
FIG. 7 shows a flow diagram of a method for manufacturing semiconductor devices in accordance with some example embodiments.

FIG. 7 shows a flow diagram of a method according to one example. In operation 702, an interconnect bridge is embedded within a substrate. In operation 704, additional layers are formed on the substrate, including a reference voltage stack that extends over at least a portion of the interconnect bridge. In operation 706, a first die and a second die are coupled to a surface of the additional layers. In one example, the reference voltage stack is electrically coupled to a ground voltage (Vss) source and/or a power supply voltage (Vcc) source during operation 706. In operation 708, at least one passive component is physically coupled to the surface of the additional layers, and electrically coupled to two or more levels, adapted to operate at two different reference voltages. In one example, the at least one passive component is coupled to the surface of the additional layers through example solder connection formed between a terminal pad of the at least one passive component and a contact pad of the substrate.

Figure 8:
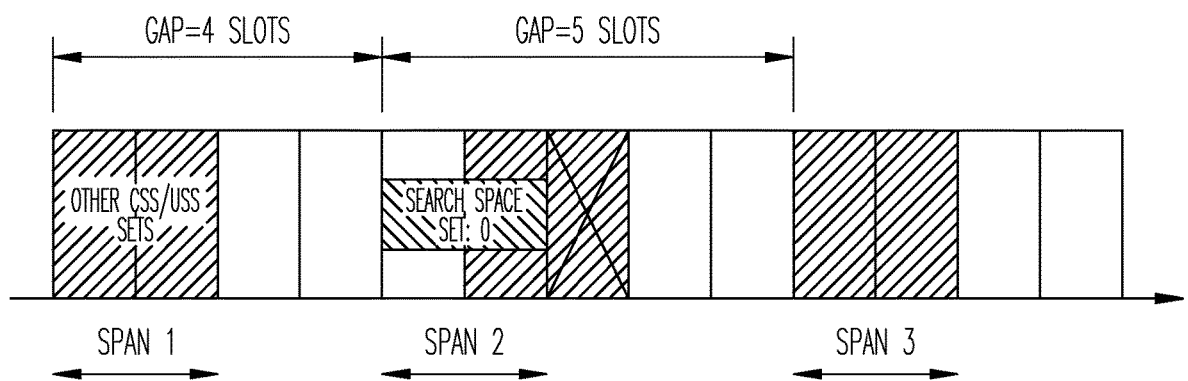
FIG. 8 shows a system that may incorporate semiconductor devices and methods, in accordance with some example embodiments.
Figure 9B:
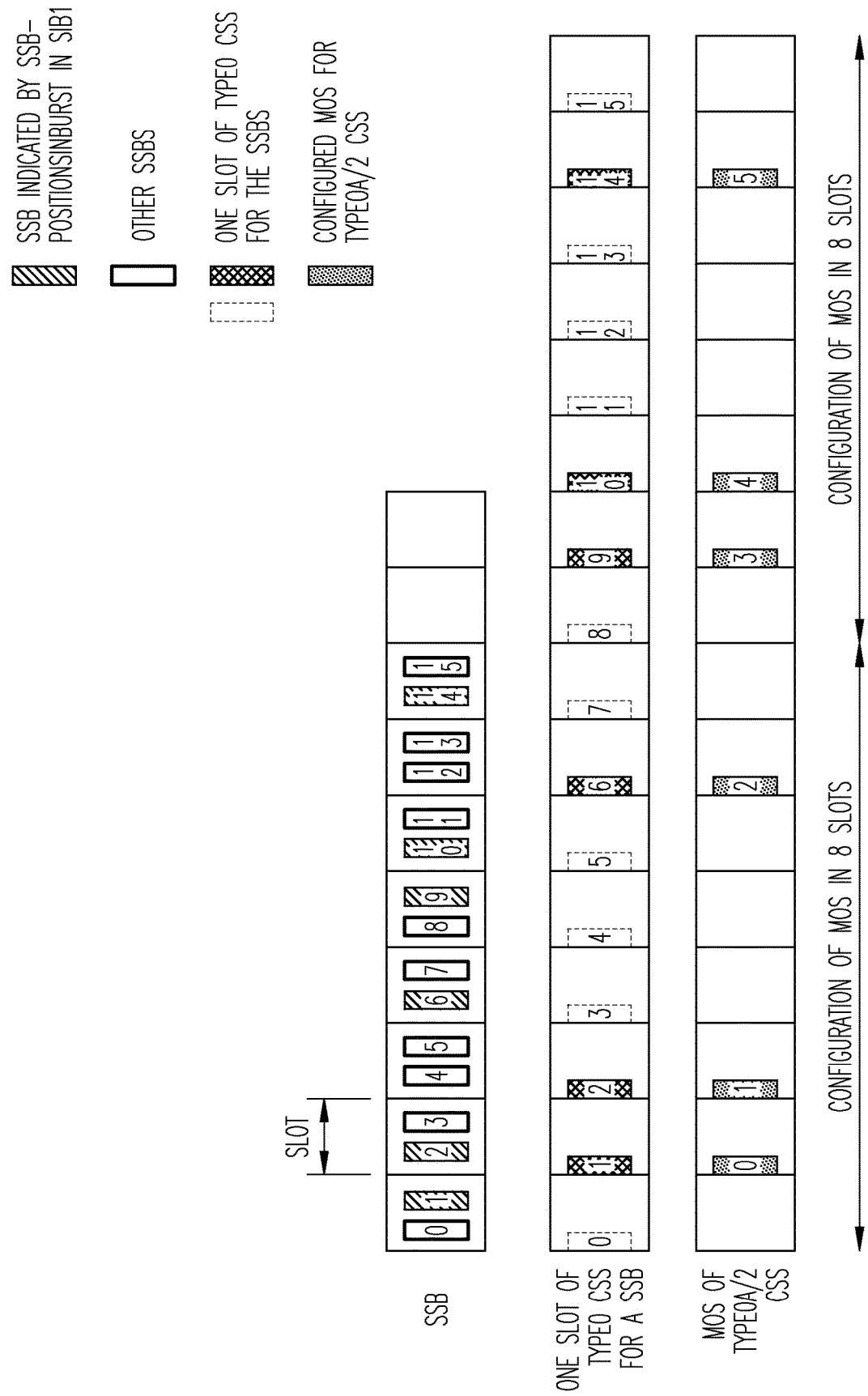
Figure 9C:
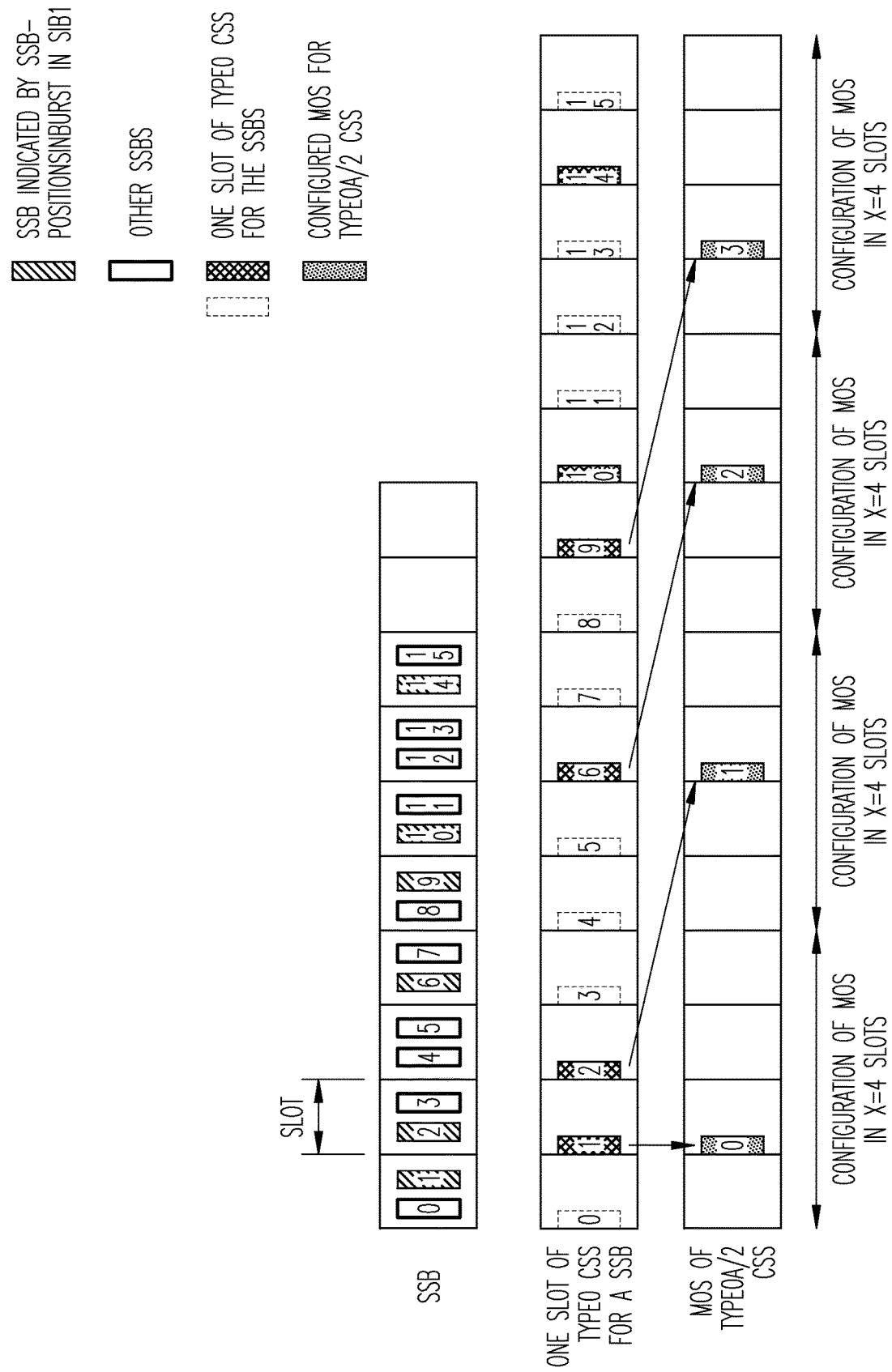
Figure 12:
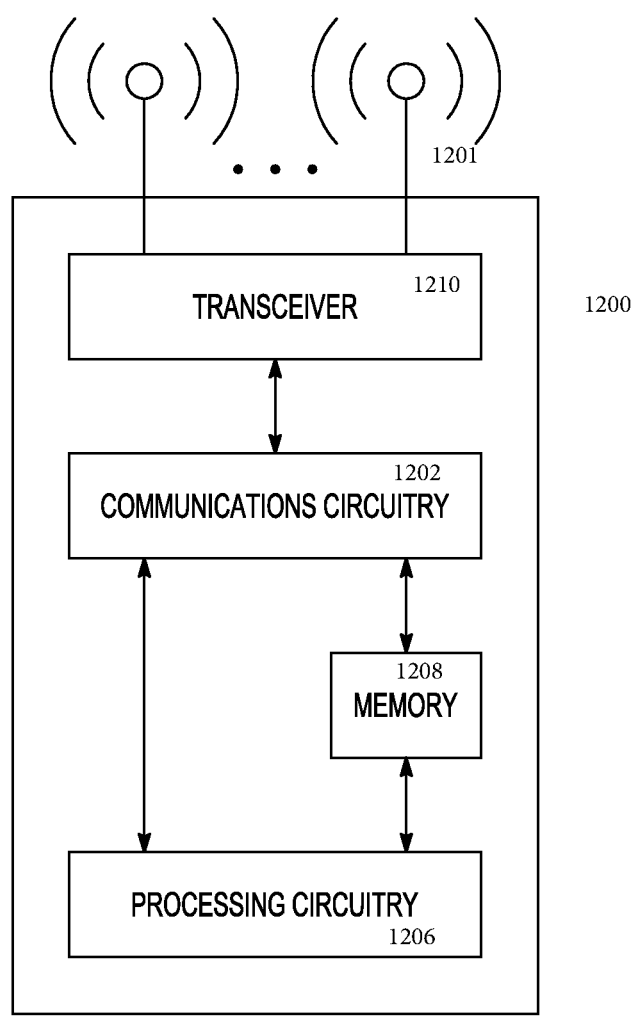

FIG. 8 illustrates a system level diagram, depicting an example of an electronic device (e.g., system) that may include multiple dies, interconnect bridges, reference voltage stacks, and passive components as described above.

FIG. 8 may also illustrate a system level diagram of an electronic device used to execute examples of the methods described above. In one embodiment, system 800 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 800 is a system on a chip (SOC) system.

In one embodiment, processor 810 has one or more processor cores 812 and 812N, where 812N represents the Nth processor core inside processor 810 where N is a positive integer. In one embodiment, system 800 includes multiple processors including 810 and 805, where processor 805 has logic similar or identical to the logic of processor 810. In some embodiments, processing core 812 includes, but is not limited to, pre-fetch logic to fetch instructions, decode logic to decode the instructions, execution logic to execute instructions and the like. In some embodiments, processor 810 has a cache memory 816 to cache instructions and/or data for system 800. Cache memory 816 may be organized into a hierarchal structure including one or more levels of cache memory.

In some embodiments, processor 810 includes a memory controller 814, which is operable to perform functions that enable the processor 810 to access and communicate with memory 830 that includes a volatile memory 832 and/or a non-volatile memory 834. In some embodiments, processor 810 is coupled with memory 830 and chipset 820. Processor 810 may also be coupled to a wireless antenna 878 to communicate with any device configured to transmit and/or receive wireless signals. In one embodiment, an interface for wireless antenna 878 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 832 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 834 includes, but is not limited to, flash memory, phase change memory (PCM), read-only memory (ROM), electrically erasable programmable read-only memory (EEPROM), or any other type of non-volatile memory device.

Memory 830 stores information and instructions to be executed by processor 810. In one embodiment, memory 830 may also store temporary variables or other intermediate information while processor 810 is executing instructions. In the illustrated embodiment, chipset 820 connects with processor 810 via Point-to-Point (PtP or P-P) interfaces 817 and 822. Chipset 820 enables processor 810 to connect to other elements in system 800. In some embodiments of the example system, interfaces 817 and 822 operate in accordance with a PtP communication protocol such as the Intel® QuickPath Interconnect (QPI) or the like. In other embodiments, a different interconnect may be used.

In some embodiments, chipset 820 is operable to communicate with processor 810, 805N, display device 840, and other devices, including a bus bridge 872, a smart TV 876, I/O devices 874, nonvolatile memory 860, a storage medium (such as one or more mass storage devices) 862, a keyboard/mouse 864, a network interface 866, and various forms of consumer electronics 877 (such as a PDA, smart phone, tablet etc.), etc. In one embodiment, chipset 820 couples with these devices through an interface 824. Chipset 820 may also be coupled to a wireless antenna 878 to communicate with any device configured to transmit and/or receive wireless signals.

Chipset 820 connects to display device 840 via interface 826. Display 840 may be, for example, a liquid crystal display (LCD), a light emitting diode (LED) array, an organic light emitting diode (OLED) array, or any other form of visual display device. In some embodiments of the example system, processor 810 and chipset 820 are merged into a single SOC. In addition, chipset 820 connects to one or more buses 850 and 855 that interconnect various system elements, such as I/O devices 874, nonvolatile memory 860, storage medium 862, a keyboard/mouse 864, and network interface 866. Buses 850 and 855 may be interconnected together via a bus bridge 872.

In one embodiment, mass storage device 862 includes, but is not limited to, a solid state drive, a hard disk drive, a universal serial bus flash memory drive, or any other form of computer data storage medium. In one embodiment, network interface 866 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 8 are depicted as separate blocks within the system 800, the functions performed by some of these blocks may be integrated within a single semiconductor circuit or may be implemented using two or more separate integrated circuits. For example, although cache memory 816 is depicted as a separate block within processor 810, cache memory 816 (or selected aspects of 816) can be incorporated into processor core 812.

To better illustrate the method and apparatuses disclosed herein, a non-limiting list of embodiments is provided here:

Example 1 includes a semiconductor device. The semiconductor device includes a first die and a second die coupled to a surface of a substrate, an interconnect bridge embedded within the substrate, and coupled between the first die and the second die, a reference voltage stack extending over at least a portion of the interconnect bridge, the reference voltage stack including at least two levels, adapted to operate at two different reference voltages, and at least one passive component located on the substrate and coupled to the reference voltage stack.

Example 2 includes the semiconductor device of example 1, wherein the at least one passive component is located on the surface of the substrate, between the first die and the second die.

Example 3 includes any of examples 1-2, wherein the at least one passive component is embedded beneath the surface of the substrate, between the first die and the second die.

Example 4 includes any of examples 1-3, wherein the reference voltage stack includes a power source and a ground source.

Example 5 includes any of examples 1-4, wherein the at least one passive component includes a capacitor.

Example 6 includes any of examples 1-5, wherein the reference voltage stack includes three or more voltage levels, including a ground level and two different power levels.

Example 7 includes any of examples 1-6, wherein the interconnect bridge is a silicon bridge.

Example 8 includes a semiconductor device. The semiconductor device includes a first die and a second die coupled to a surface of a substrate, an interconnect bridge embedded within the substrate, and coupled between the first die and the second die, a reference plane stack extending over at least a portion of the interconnect bridge, the reference plane stack including at least two reference plane levels, adapted to operate at two different reference voltages, and at least one passive component located on the substrate and coupled to the reference plane stack.

Example 9 includes the semiconductor device of example 8, wherein the at least one passive component is coupled to a top of an upper reference plane, and also coupled through an opening in the upper reference plane to a lower reference plane.

Example 10 includes the semiconductor device of any of examples 8-9, wherein the reference plane stack is further coupled to one or more planes within the interconnect bridge.

Example 11 includes the semiconductor device of any of examples 8-10, wherein the reference plane stack includes two coplanar partial planes, each with a different power level and a ground plane.

Example 12 includes the semiconductor device of any of examples 8-11, wherein one or more individual reference planes in the reference plane stack is coupled to a power connection on a bottom surface of the substrate through one or more edge vias.

Example 13 includes the semiconductor device of any of examples 8-12, wherein the at least one passive component includes a capacitor.

Example 14 includes a method of forming a semiconductor device, comprising embedding an interconnect bridge within a substrate, forming additional layers on the substrate, including a reference voltage stack that extends over at least a portion of the interconnect bridge, coupling a first die and a second die to a surface of the additional layers, and physically coupling at least one passive component to the surface of the additional layers, and electrically coupling the at least one passive component to two or more levels, adapted to operate at two different reference voltages.

Example 15 includes the method of example 14, wherein embedding the interconnect bridge within a substrate includes overmolding the interconnect bridge with an encapsulant material.

Example 16 includes the method of any of examples 14-15, wherein embedding the interconnect bridge within a substrate includes embedding a silicon interconnect bridge.

Example 17 includes the method of any of examples 14-16, wherein embedding the interconnect bridge within a substrate includes embedding an organic interconnect bridge.

Example 18 includes the method of any of examples 14-17, wherein forming additional layers on the substrate, including a reference voltage stack includes forming multiple voltage reference planes separated by dielectric layers.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The foregoing description, for the purpose of explanation, has been described with reference to specific example embodiments. However, the illustrative discussions above are not intended to be exhaustive or to limit the possible example embodiments to the precise forms disclosed. Many modifications and variations are possible in view of the above teachings. The example embodiments were chosen and described in order to best explain the principles involved and their practical applications, to thereby enable others skilled in the art to best utilize the various example embodiments with various modifications as are suited to the particular use contemplated.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

The terminology used in the description of the example embodiments herein is for the purpose of describing particular example embodiments only and is not intended to be limiting. As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

The invention claimed is:

1. A semiconductor device, comprising:
   a first die and a second die coupled to a surface of a substrate;
   an interconnect bridge embedded within the substrate, and coupled between the first die and the second die;
   a reference voltage stack extending over at least a portion of the interconnect bridge, the reference voltage stack including at least two planes located one over another with at least one via passing through one of the planes, the planes adapted to operate at two different reference voltages; and
   at least one passive component located on the substrate and coupled to the reference voltage stack, wherein the at least one passive component is located within a lateral footprint of a space between the first die and the second die.

2. The semiconductor device of claim 1, wherein the at least one passive component is located on the surface of the substrate, between the first die and the second die.

3. The semiconductor device of claim 1, wherein the at least one passive component is embedded beneath the surface of the substrate, between the first die and the second die.

4. The semiconductor device of claim 1, wherein the reference voltage stack includes a power source and a ground source.

5. The semiconductor device of claim 1, wherein the at least one passive component includes a capacitor.

6. The semiconductor device of claim 1, wherein the reference voltage stack includes three or more voltage levels, including a ground level and two different power levels.

7. The semiconductor device of claim 1, wherein the interconnect bridge is a silicon bridge.

8. A semiconductor device, comprising:
   a first die and a second die coupled to a surface of a substrate;
   an interconnect bridge embedded within the substrate, and coupled between the first die and the second die;

a reference plane stack extending over at least a portion of the interconnect bridge, the reference plane stack including at least two reference planes located one over another with at least one via passing through one of the planes, the planes adapted to operate at two different reference voltages; and at least one passive component located on the substrate and coupled to the reference plane stack, wherein the at least one passive component is located within a lateral footprint of a space between the first die and the second die.

9. The semiconductor device of claim 8, wherein the at least one passive component is coupled to a top of an upper reference plane, and also coupled through an opening in the upper reference plane to a lower reference plane.

10. The semiconductor device of claim 8, wherein the reference plane stack is further coupled to one or more planes within the interconnect bridge.

11. The semiconductor device of claim 8, wherein the reference plane stack includes two coplanar partial planes, each with a different power level and a ground plane.

12. The semiconductor device of claim 8, wherein one or more individual reference planes in the reference plane stack is coupled to a power connection on a bottom surface of the substrate through one or more edge vias.

13. The semiconductor device of claim 8, wherein the at least one passive component includes a capacitor.

* * * * *